(12) United States Patent
Tindel et al.

(10) Patent No.: US 11,756,816 B2
(45) Date of Patent: Sep. 12, 2023

(54) CARRIER FOUP AND A METHOD OF PLACING A CARRIER

(71) Applicant: Applied Materials, Inc., Santa Clara, CA (US)

(72) Inventors: Steven Trey Tindel, Austin, TX (US); Alexander N. Lerner, San Jose, CA (US); Kim Ramkumar Vellore, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 499 days.

(21) Appl. No.: 16/568,910

(22) Filed: Sep. 12, 2019

(65) Prior Publication Data

US 2021/0028039 A1 Jan. 28, 2021

Related U.S. Application Data

(60) Provisional application No. 62/879,367, filed on Jul. 26, 2019.

(51) Int. Cl.
*H01L 21/68* (2006.01)
*H01L 21/673* (2006.01)

(52) U.S. Cl.
CPC .. *H01L 21/67386* (2013.01); *H01L 21/67346* (2013.01); *H01L 21/67363* (2013.01); *H01L 21/67383* (2013.01); *H01L 21/68* (2013.01)

(58) Field of Classification Search
CPC ......... H01L 21/67386; H01L 21/67346; H01L 21/67363; H01L 21/67383; H01L 21/68
USPC ......................................... 206/710, 711, 454
See application file for complete search history.

(56) References Cited

U.S. PATENT DOCUMENTS

| 4,071,944 A | 2/1978 | Chuss et al. |
| 4,915,057 A | 4/1990 | Boudreau et al. |
| 4,952,420 A | 8/1990 | Walters |
| 5,354,380 A | 10/1994 | Zejda |
| 5,503,675 A | 4/1996 | Zejda |

(Continued)

FOREIGN PATENT DOCUMENTS

| CN | 1244165 C | 3/2006 |
| CN | 200944704 Y | 9/2007 |

(Continued)

OTHER PUBLICATIONS

Entegris A300 FOUP, www.entegris.com/content/dam/product-assets/a300g3foupwafercarrier/datasheet-a300- foup-7309.pdf, published 2012, accessed Jul. 23, 2019.

(Continued)

*Primary Examiner* — Steven A. Reynolds
(74) *Attorney, Agent, or Firm* — Patterson + Sheridan, LLP

(57) ABSTRACT

A carrier FOUP and a method of placing a carrier are provided. The carrier FOUP includes a body and a door. The body includes a plurality of chamfers, and one or more carriers are placed on, and supported by, the plurality of chamfers. The method of placing a carrier includes placing the carrier in the carrier FOUP and closing the door of the carrier FOUP. When the door is closed, the door pushes against the carrier and aligns the carrier with the alignment feature. The alignment features align the carrier, removing the need to be aligned by the factory interface robot when placing or removing the carrier from the carrier FOUP.

20 Claims, 4 Drawing Sheets

(56) References Cited

U.S. PATENT DOCUMENTS

| | | | |
|---|---|---|---|
| 6,082,540 A * | 7/2000 | Krampotich | H01L 21/67369 206/711 |
| 6,267,245 B1 * | 7/2001 | Bores | H01L 21/67383 206/711 |
| 6,665,053 B2 | 12/2003 | Korenaga | |
| 6,817,823 B2 | 11/2004 | Fix et al. | |
| 6,851,170 B2 | 2/2005 | Lappen et al. | |
| 7,922,000 B2 * | 4/2011 | Hyobu | H01L 21/67346 211/41.18 |
| 8,282,089 B2 | 10/2012 | Heimel et al. | |
| 8,361,230 B2 | 1/2013 | Manz | |
| 8,427,253 B2 | 4/2013 | Satake et al. | |
| 8,464,872 B2 * | 6/2013 | Inoue | H01L 21/67383 206/711 |
| 8,686,819 B2 | 4/2014 | Schuessler et al. | |
| 8,817,376 B2 | 8/2014 | Lee et al. | |
| 8,910,792 B2 * | 12/2014 | Nagashima | H01L 21/67369 206/711 |
| 9,013,795 B2 | 4/2015 | Lee et al. | |
| 9,045,818 B2 | 6/2015 | Gersdorff et al. | |
| 9,463,543 B2 | 10/2016 | White et al. | |
| 9,633,877 B2 * | 4/2017 | Gregerson | H01L 21/67383 |
| 9,922,854 B2 | 3/2018 | Kurita et al. | |
| 10,070,520 B2 | 9/2018 | Tomita et al. | |
| 10,077,207 B2 | 9/2018 | Lee et al. | |
| 2004/0123952 A1 | 7/2004 | Hur et al. | |
| 2005/0274645 A1 * | 12/2005 | Hasegawa | H01L 21/67369 257/E21.001 |
| 2006/0283774 A1 * | 12/2006 | Hasegawa | H01L 21/67369 206/832 |
| 2007/0009671 A1 | 1/2007 | Manz | |
| 2009/0026109 A1 * | 1/2009 | Hasegawa | H01L 21/67373 206/711 |
| 2010/0258475 A1 * | 10/2010 | Ogawa | H01L 21/67369 206/711 |
| 2013/0135741 A1 | 5/2013 | Lee et al. | |
| 2013/0299384 A1 * | 11/2013 | Fuller | H01L 21/67369 53/485 |
| 2015/0228517 A1 | 8/2015 | Toc et al. | |
| 2017/0103910 A1 | 4/2017 | Chiou et al. | |
| 2018/0068879 A1 | 3/2018 | Wong et al. | |
| 2018/0308710 A1 | 10/2018 | Chan et al. | |
| 2018/0376591 A1 | 12/2018 | Tomita et al. | |
| 2019/0010083 A1 | 1/2019 | Lee et al. | |
| 2019/0139792 A1 | 5/2019 | Liu et al. | |

FOREIGN PATENT DOCUMENTS

| | | |
|---|---|---|
| CN | 101604499 B | 4/2011 |
| CN | 102195588 A | 9/2011 |
| CN | 202189772 U | 4/2012 |
| CN | 102760679 A | 10/2012 |
| CN | 103572240 A | 2/2014 |
| CN | 204490492 U | 7/2015 |
| CN | 104820306 A | 8/2015 |
| CN | 106148908 A | 11/2016 |
| CN | 108165927 A | 6/2018 |
| CN | 208142163 U | 11/2018 |
| CN | 109561580 A | 4/2019 |
| DE | 29707686 U1 | 6/1997 |
| EP | 2494646 B1 | 12/2017 |
| EP | 2852469 B1 | 4/2019 |
| JP | 2001044271 A | 2/2001 |
| JP | 3158181 B2 | 4/2001 |
| JP | 2010206232 A | 9/2010 |
| JP | 2013245392 A | 12/2013 |
| JP | 2015012083 A | 1/2015 |
| KR | 20180059804 A | 6/2018 |
| TW | 200730419 A | 8/2007 |
| WO | 1990004320 A2 | 4/1990 |
| WO | 2012053402 A1 | 4/2012 |
| WO | 2014114360 A1 | 7/2014 |
| WO | 2018153480 A1 | 8/2018 |
| WO | 2018153481 A1 | 8/2018 |
| WO | 2018166636 A1 | 9/2018 |
| WO | 2019020166 A1 | 1/2019 |
| WO | 2019091561 A1 | 5/2019 |
| WO | 2019101319 A1 | 5/2019 |
| WO | 2019114806 A1 | 6/2019 |

OTHER PUBLICATIONS

International Search Report/ Written Opinion issued to PCT/US2020/038499 dated Sep. 28, 2020.

* cited by examiner

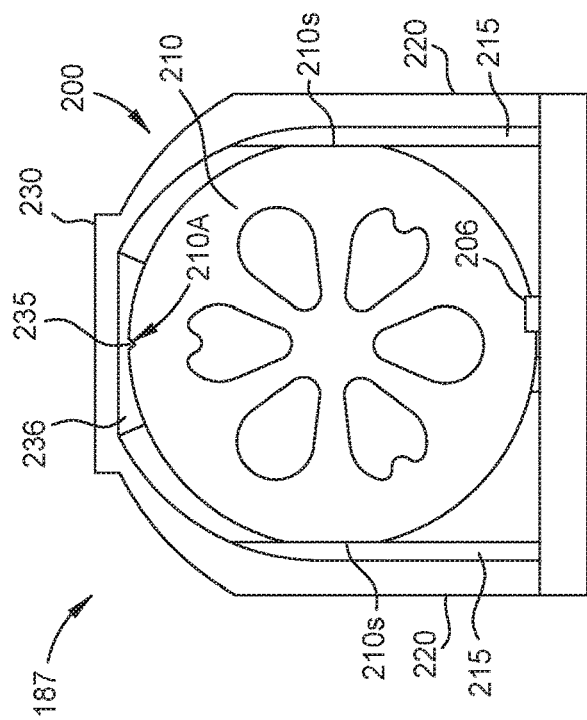
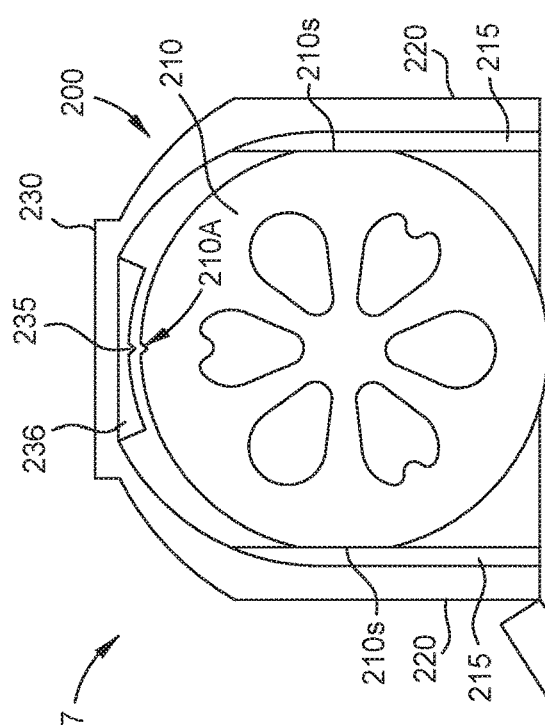
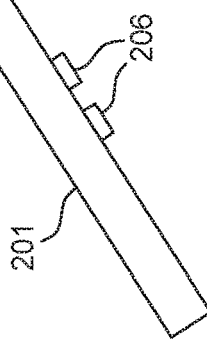
FIG. 4A
FIG. 4B
FIG. 4C

CARRIER FOUP AND A METHOD OF PLACING A CARRIER

CROSS-REFERENCE TO RELATED APPLICATIONS

This application claims priority to U.S. Provisional Patent Application No. 62/879,367, filed Jul. 26, 2019, which is hereby incorporated by reference in its entirety.

BACKGROUND

Field

Embodiments of the invention relate to an apparatus and a method and, more specifically, to a carrier front opening unified pod (FOUP) and a method of placing a carrier.

Description of the Related Art

Evaporation chambers are tools for the production of layers of a photodiode, and the photodiode can be used in CMOS image sensor (CIS) or organic light emitting diode (OLED) applications. As an example, different organic material can be selectively deposited for different, respective pixels in a CIS utilizing an organic photoconductive film (OPF). Certain pixels (e.g., for sensing red light) can utilize a first organic material, while other pixels (e.g., for sensing green or blue light) can utilize a second, different organic material. In addition to the deposition of organic layers, other processes can be performed, such as pre-clean or deposition of inorganic layers, can be performed to form the photodiode. Evaporation chambers are often included in processing systems that include multiple deposition, processing, and transfer chambers.

Carrier front opening unified pods (FOUPs) are specialized enclosures designed to hold carriers and/or substrates securely and safely in a controlled environment, and to allow the carriers and/or wafers to be transferred between machines for processing or measurement. For example, a carrier can be stored while other carriers are being moved in and around the processing system. The carrier can be moved from the carrier FOUP using a factory interface, which includes specialized factory interface robots. In some deposition systems, a carrier supports a substrate in a certain angular orientation, because deposition on the substrate occurs only at specified portions of the substrate.

One drawback of carrier FOUPs in the art is that carrier FOUPS have no way of aligning carriers when they are placed in the carrier FOUP. The alignment of the carriers to ensure proper angular rotation of the carrier needs to be done by the factory interface robot, resulting in more complicated and expensive robots. In addition, carrier FOUPs do not have ways of easily securing carriers, which prevents the carriers from being damaged during storage. Also, many carrier FOUPs do not have space to support a substrate along with the carrier during storage in the carrier FOUP.

Therefore, there is a need for a carrier FOUP that can align carriers stored therein.

SUMMARY

Embodiments disclosed herein generally relate to a carrier FOUP and methods of storing a carrier. The carrier FOUP includes alignment features that ensure that the carrier is aligned within the carrier FOUP, without needing a complicated factory interface robot to align the carrier during transport in and out of the carrier FOUP. The method of storing a carrier aligns the carrier within the FOUP.

According to one embodiment, a carrier front opening unified pod (FOUP) is provided, including a body and a door. The body includes a plurality of side walls and a back wall. Each side wall includes a plurality of chamfers configured to support a straight portion of a carrier. The back wall includes a plurality of alignment features configured to align the carrier.

According to another embodiment, a carrier front opening unified pod (FOUP) is provided, including a body and a door. The body includes a plurality of side walls and a back wall. Each side wall includes a plurality of chamfers configured to support a straight portion of a carrier. The back wall includes a plurality of alignment features configured to align the carrier. The door includes a capture apparatus. The capture apparatus includes a capture carrier base and a plurality of capture features.

According to yet another embodiment, a method of storing a carrier is provided, including placing the carrier in a carrier front opening unified pod (FOUP) and closing the door of the carrier FOUP. The carrier FOUP includes a body and a door. The body includes a plurality of side walls and a back wall. Each side wall includes a plurality of chamfers configured to support a straight portion of a carrier. The back wall includes a plurality of alignment features configured to align the carrier. The carrier is disposed over a chamfer on either side of the carrier, and such that a straight portion of the carrier is supported by the chamfers.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 4A illustrates a top view of the carrier FOUP with the door open, according to one embodiment.

FIG. 4B illustrates a plurality of chamfers, according to one embodiment.

FIG. 4C illustrates a top view of the carrier FOUP with the door closed, according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

As used herein, the term "about" refers to a +/−10% variation from the nominal value. It is to be understood that such a variation can be included in any value provided herein.

Embodiments of the disclosure include a carrier FOUP. The carrier FOUP includes a body and a door. The side walls of the body include a plurality of chamfers configured to support a carrier, and the back wall of the body includes plurality of alignment features configured to align the carrier. The alignment features align the carrier, so that the carrier is correctly oriented when being removed from the carrier FOUP and no alignment is necessary outside the carrier FOUP. The door includes a capture apparatus that secures the carrier inside the carrier FOUP. The carrier FOUP aligns and secures a plurality of carriers placed in the carrier FOUP. Embodiments of the disclosure may be useful for, but are not limited to, a carrier FOUP with features for aligning and securing a plurality of carriers.

Figure 1:
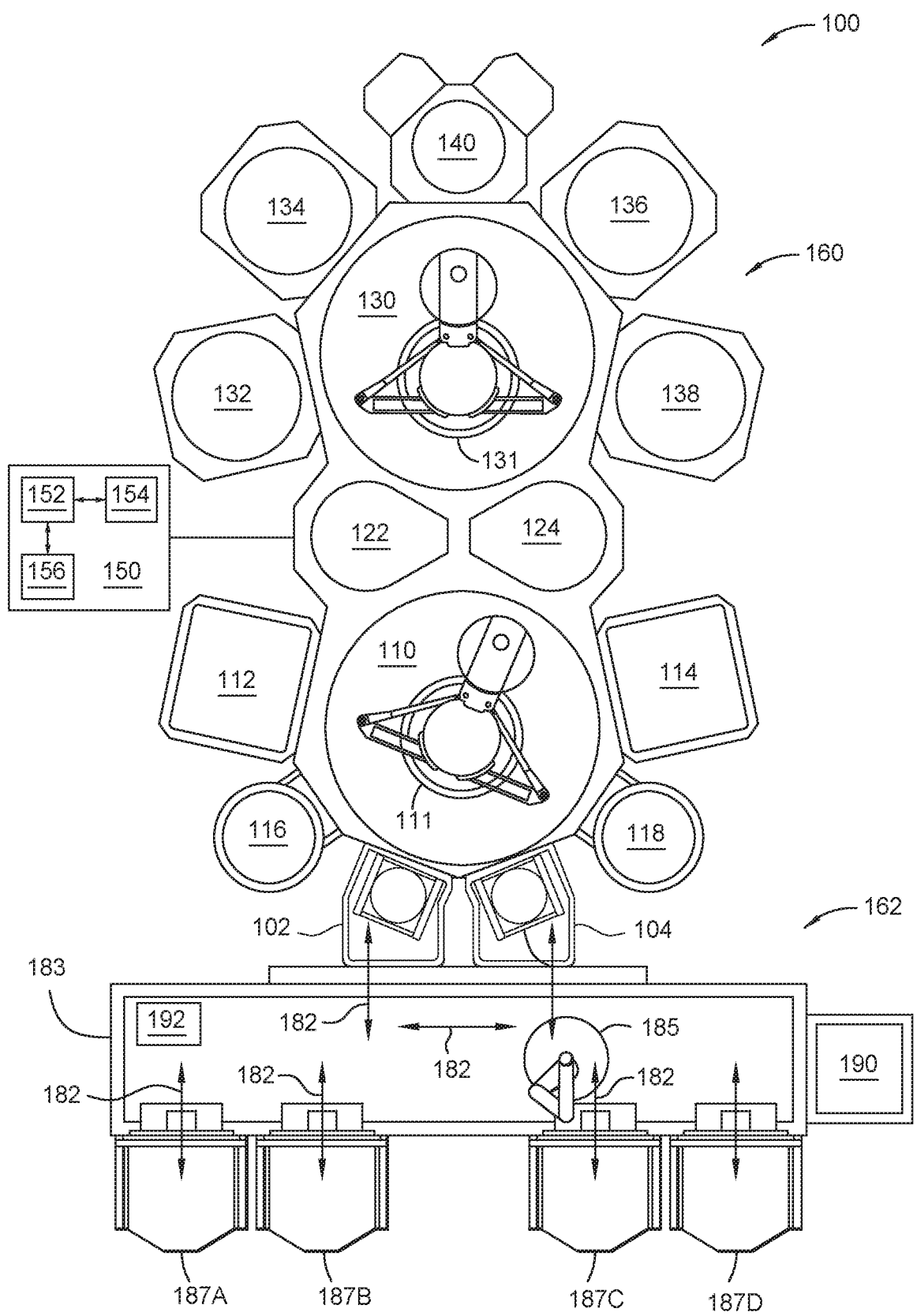
FIG. 1 illustrates a schematic plan view of a processing system, according to one embodiment.

FIG. 1 illustrates a schematic plan view of a processing system 100, according to one embodiment. As shown, the processing system 100 includes a vacuum-tight processing platform 160, a factory interface 162, and a controller 150. Further, the processing system 100 is alternatively referred to as a cluster tool or multi-chamber processing system. The processing system 100 is configured to deposit one or more metal oxide layers and/or organic materials on a substrate to fabricate a light sensing device. For example, the light sensing device can be an organic image sensing device. An example of a processing system includes the ENDURA® system, commercially available from Applied Materials, Inc. of Santa Clara, Calif. Alternatively, other substrate processing systems can be also be modified in accordance with the present disclosure.

As shown, the processing platform 160 includes processing chambers 112, 114, 116, 118, 132, 134, 138, 136, 140, transfer chambers 110, 130, pass through chambers 122, 124, and load lock chambers 102, 104. The pass through chambers 122, 124 allow a substrate to be transferred between the transfer chambers 110 and 130. The load lock chambers 102, 104 are pumped down to be operated under a vacuum before transferring substrates from the factory interface 162 to the transfer chamber 110. The processing platform 160 is configured to move substrates to and from the various chambers included in the processing platform.

The processing chambers 112, 114, 116, 118, 132, 134, 138, 136, 140 are configured in any manner suitable to process a substrate. For example, the processing chambers 112, 114, 116, 118, 132, 134, 138, 136, 140 are configured to deposit one or more metal oxide layers, one or more organic films and apply one or more cleaning processes to a substrate to create a semiconductor device such as a photodiode, a light sensing device, or the like.

A first of the processing chambers 112, 114, 116, 118 are configured to perform a pre-clean process to eliminate contaminants and/or degas volatile components from a substrate prior to transferring the substrate into another process chamber. The processing chamber 138 can be configured to deposit one or more layers on a substrate. The one or more layers can include indium tin oxide (ITO), silicon oxide, silicon nitride, aluminum oxide, or any suitable material. The processing chambers 132, 134, 136 are configured to deposit one or more organic films on a substrate. Further, the processing chamber 140 can be configured to position a mask (e.g., a shadow mask) on a substrate before the substrate is transferred to one or more the processing chambers 132, 134, 136 and 138 and unload a mask from a substrate after processing within one or more of the processing chambers 132, 134, 136, and 138. The processing chambers 132, 134, 138, 136 are configured to deposit materials (e.g., metal oxide layers or organic films) using a chemical deposition process such as chemical vapor deposition (CVD), atomic layer deposition (ALD), metalorganic chemical vapor deposition (MOCVD), plasma-enhanced chemical vapor deposition (PECVD), and physical vapor deposition (PVD) (e.g., sputtering process or evaporation process), among others.

As shown, the factory interface 162 includes docking station 183, factory interface robot 185, and substrate carrier chamber 190. The factory interface robot 185 is capable of linear and rotational movement illustrated by arrows 182. The substrate carrier chamber 190 mounts the substrate on a carrier (e.g., a chuck) or removes the substrate from the carrier. The carrier can include one or more conductive elements (e.g., chucking electrodes) configured to electrostatically hold (e.g., "chuck") the substrate against the carrier. The carrier and "chucked" substrate are transferred by the factory interface robot 185 from the substrate carrier chamber 190 to one or more of the load lock chambers 102, 104. The factory interface 162 is configured to move carriers and substrates from the substrate carrier chamber 190 to the load lock chambers 102, 104.

As shown, the docking station 183 includes carrier front opening unified pods (FOUPs) 187A-187D. The factory interface robot 185 transfers substrates between the carrier FOUPs 187, the load lock chambers 102, 104 and the substrate carrier chamber 190. Additionally, the carrier and a processed substrate are transferred from the load lock chambers 102, 104 to the substrate carrier chamber 190 such that the processed substrate is removed from the carrier, and the processed substrate is transferred from the substrate carrier chamber 190 to one of the carrier FOUPs 187 by the factory interface robot 185. One or more pre-aligner can be disposed in the factory interface 162 to align the substrate and the carrier. For example, a first pre-aligner is utilized to align the substrate by identifying the center of the substrate and a notch on the substrate for proper clocking. A second pre-aligner is utilized to align the carrier by identifying the center of the carrier and a notch on the carrier for proper clocking. In other embodiments, the carrier FOUPs 187 include alignment features, such that the factory interface 162 does not require pre-alignment features, as described in more detail below. The docking station 183 is configured to allow the transfer of carriers and chucked substrates from the carrier FOUPs 187 to the substrate carrier chamber 190.

As shown, the transfer chamber 110 includes a transfer robot 111. The transfer robot 111 transfers substrates to and from the load lock chambers 102, 104, to and from the processing chambers 112, 114, 116, 118, and to and from pass through chambers 122, 124. The pass through chambers 122, 124 maintain vacuum conditions while allowing substrates to be transferred within the processing system 100 between transfer chambers 110, 130. The transfer robot 131 transfers substrates between the pass through chambers 122, 124 and the processing chambers 132, 134, 136, 138, and 140, and between the processing chambers 132, 134, 136, 138, and 140. The transfer chamber 110 is configured to temporarily house carriers and substrates while waiting to be passed into the pass through chamber 122, 124.

As shown, the controller 150 includes a central processing unit (CPU) 152, a memory 154, and support circuits 156. The CPU 152 is any general purpose computer processor that can be utilized in an industrial environment. The support circuits 156 are coupled to the CPU 152 and include cache, clock circuits, input/output subsystems, power supplies and the like. Software routines can be stored within the memory 154. The software routines are executed by the CPU 152 and thus adapted to cause various components within the processing system 100 to perform one or more of the methods described herein. Alternatively, or additionally, one or more of the software routines can be executed by a second CPU not illustrated. The second CPU can be part of the controller 150 or remote from the controller 150. The controller 150 is any suitable controller for controlling the operation of one or more of the processing chambers 112, 114, 116, 118, 132, 134, 138, 136, 140, the transfer chambers 110, 130, pass through chambers 122, 124, and the factory interface 162. For example, the controller 150 is configured to control the operation of transfer robot 111 and/or the transfer robot 131. The controller 150 is configured to control the components of the processing system 100.

One or more processing chambers, one or more transfer chambers, one or more pass through chambers, and/or the factory interface can include a dedicated controller or controllers (not shown) configured to control at least a portion of the methods disclosed herein. The dedicated controllers can be configured similar to the controller 150 and can be coupled with the controller 150 to synchronize processing of a substrate within the processing system 100.

Figure 2:
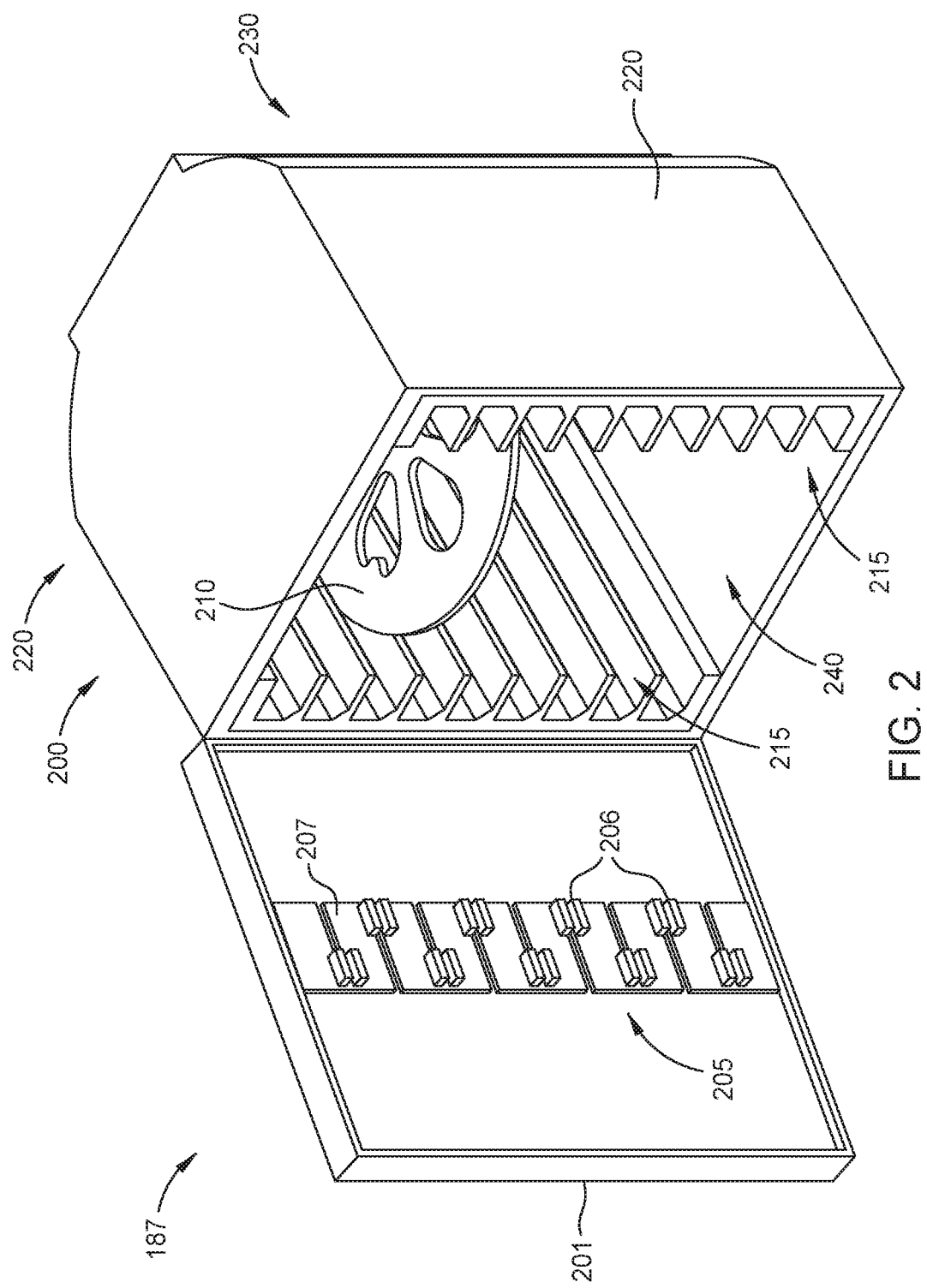
FIG. 2 illustrates a perspective view of a carrier FOUP, according to one embodiment.

FIG. 2 illustrates a perspective view of a carrier FOUP 187, according to one embodiment. As shown, the carrier FOUP 187 includes a body 200 and a door 201. The body 200 and the door 201 can be made of any suitable material, such as metal or plastic, for example, polycarbonate. The material of the door 201 and the body 200 is chosen to prevent particle contamination and oxygen permeation, and also for controlling relative humidity. The door 201 is configured to open so one or more carriers 210 can be placed in the body 200 of the carrier FOUP 187. Carriers 210 can be delivered to and from the carrier FOUP 187 by the factory interface robot 185. The carrier FOUP 187 is configured to store and secure one or more carriers 210.

As shown, the body 200 includes a plurality of side walls 220 and a back wall 230. The side walls 220 and the back wall 230 define an interior volume 240. The side walls 220 include a plurality of chamfers 215. The chamfers 215 are configured to support one or more carriers 210. The chamfers 215 on each side wall 220 support a side 210S (FIG. 3A) of the carrier 210. The chamfers 215 can be configured to support a round or flat side of a carrier. The chamfers 215 can be removed and replaced with different chamfers made of a different material if needed for different carrier 210 materials. For example, the chamfers 215 can include glass for a carrier 210 that has unwanted electrostatic reactions with metal chamfers.

The spacing between chamfers 215 is enough so that a carrier 210 supporting a wafer can be placed in the carrier FOUP 187 such that the wafer is not scraped or damaged. The spacing between adjacent chamfers 125 is larger than the combined height of the carrier 210 and a substrate, according to one embodiment. The spacing between the chamfers 215 can be, for example, about 10 mm to about 30 mm, and the thickness of the chamfer can be from about 1 mm to about 10 mm, which allows for room for a carrier 210 with up to about 5 mm of thickness.

As shown, the back wall 230 includes a plurality of shelves 236 and a plurality of alignment features 235 (FIG. 4A). The plurality of shelves 236 support the carrier 210. The carrier 210 includes an alignment portion 210A (FIG. 4A), and the plurality of alignment features 235 are configured to align the carrier when the carrier is placed in the carrier FOUP 187, according to one embodiment. The alignment feature 235 ensures that the carrier 210 is properly rotated when being placed in the carrier FOUP 187. The alignment features 235 include a wedge insert, and the carrier 210 includes a wedge portion that fits into the wedge insert, according to one embodiment. This alignment is important for cases when the substrate carried by the carrier 210 has a specific angular rotation needed for deposition. For example, the carrier 210 includes electrodes, and the carrier is rotationally aligned with respect to the electrodes. Ensuring that the carrier 210 is properly aligned when the carrier is placed in the carrier FOUP 187 removes the need for factory interface robot 185 to rotate the carrier outside of the carrier FOUP.

As shown, the door 201 includes a capture apparatus 205. The capture apparatus 205 includes a capture carrier base 207 and a plurality of capture features 206, according to one embodiment. The plurality of capture features 206 are disposed on the capture carrier base 207. The capture features 206 can be any apparatus used to secure the carrier 210, such as clasps or clips. The capture feature 206 can secure the flat side 210S of the carrier 210. The capture features 206 and the alignment features 235 secure the carrier 210 while the carrier is disposed in the carrier FOUP 187, according to one embodiment. The door 201 is configured such that the carrier 210 is secured by the capture feature 206 when the door is closed.

Figure 3:
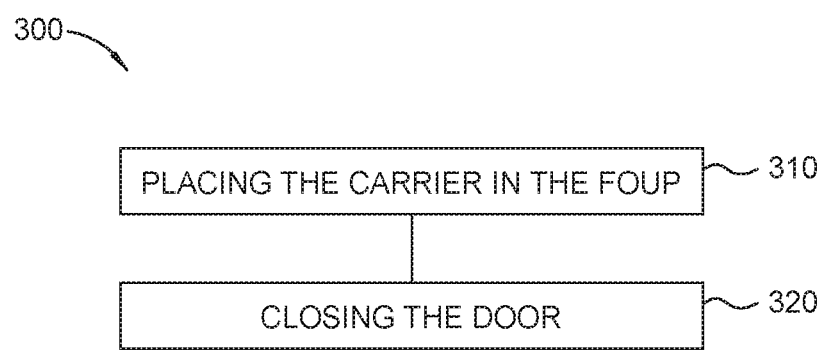
FIG. 3 is a flow diagram of method operations for placing a carrier in a carrier FOUP, according to one embodiment.

FIG. 3 is a flow diagram of method 300 operations for placing a carrier 210 in a carrier FOUP 187, according to one embodiment. Although the method operations are described in conjunction with FIGS. 3 and 4A-C, persons skilled in the art will understand that any system configured to perform the method operations, in any order, falls within the scope of the embodiments described herein.

The method 300 begins at operation 310, where the carrier 210 is placed in the carrier FOUP 187. FIG. 4A illustrates a top view of the carrier FOUP 187 with the door open, according to one embodiment. The carrier 210 is placed such that the carrier side 210S is supported by the plurality of chamfers 215. However, a portion of the carrier 210 is outside the body 200, and the alignment feature 235 is not yet aligned with the alignment portion 210A of the carrier.

FIG. 4B illustrates the plurality of chamfers 215, according to one embodiment. As shown, the chamfers 215 include a sloped portion 216 and a straight portion 217. If the carrier 210 is not placed correctly or evenly in the carrier FOUP 187, i.e., the carrier is placed too close to one of the side walls 220, the carrier slides down the sloped portion 216, assisting the carrier to settle at the desired position on the straight portion 217 of the chamfers 215.

At operation 320, the door 201 is closed. FIG. 4C illustrates a top view of the carrier FOUP 187 with the door 201 closed, according to one embodiment. Closing the door 201 pushes the door against the carrier 210, and the alignment portion 210A of the carrier matches with the alignment feature 235, ensuring the carrier is aligned in the desired fashion. In addition, the carrier 210 is secured by the capture feature 206.

As described above, a carrier FOUP includes a body and a door. The body includes a plurality of chamfers, and one or more carriers are placed on, and supported by, the plurality of chamfers. When the door is closed, the door pushes against the carrier and aligns the carrier with the alignment feature.

The alignment features align the carrier, removing the need to be aligned by the factory interface robot when placing or removing the carrier from the carrier FOUP. The capture features secure the carrier when the door is closed. The chamfers are separated such that carriers supporting the substrate can be stored in the carrier FOUP.

While the foregoing is directed to implementations of the present invention, other and further implementations of the invention may be devised without departing from the basic scope thereof, and the scope thereof is determined by the claims that follow.

We claim:

1. A carrier front opening unified pod (FOUP), comprising:
   a body, comprising:
      a plurality of side walls, each side wall comprising a plurality of chamfers, defining a plurality of stacked carrier receiving slots, each slot configured to support a carrier;
      a back wall, comprising a plurality of angular alignment features configured to align the carrier; and
      a door coupled to the body, wherein the door comprises a first plurality of capture features horizontally offset from a second plurality of capture features, the first plurality of capture features aligned with every other carrier receiving slot, the second plurality of capture features aligned with every other carrier receiving slot, the first plurality of capture features align with different carrier receiving slots than the second plurality of capture features, the first and second plurality of capture features are configured to secure carriers within the carrier receiving slots when the door is closed.

2. The carrier FOUP of claim 1, wherein a spacing between adjacent chamfers is larger than the combined height of the carrier and a substrate.

3. The carrier FOUP of claim 1, wherein
   the first and second plurality of capture features are symmetrically disposed on a capture carrier base.

4. The carrier FOUP of claim 3, wherein the first and second plurality of capture features are disposed in an alternating arrangement offset from a centerline of the door.

5. The carrier FOUP of claim 1, wherein the plurality of alignment features each comprise a curved surface facing the door.

6. The carrier FOUP of claim 1, wherein each of the plurality of chamfers comprises:
   a straight portion; and
   a sloped portion configured to push the straight portion of the carrier such that the carrier is placed level on the chamfer.

7. A carrier front opening unified pod (FOUP), comprising:
   a body, comprising:
      a plurality of side walls, each side wall comprising a plurality of chamfers, defining a plurality of stacked carrier receiving slots, each slot configured to support a carrier;
      a back wall, comprising a plurality of alignment features configured to align an electrostatic chucking carrier holding a substrate; and
      a door coupled to the body, the door comprising a capture apparatus, the capture apparatus comprising a capture carrier base, and a first plurality of capture features horizontally offset from a second plurality of capture features, the first plurality of capture features aligned with every other carrier receiving slot, the second plurality of capture features aligned with every other carrier receiving slot, the first plurality of capture features align with different carrier receiving slots than the second plurality of capture features, the first and second plurality of capture features are configured to secure carriers within the carrier receiving slots when the door is closed.

8. The carrier FOUP of claim 7, wherein a spacing between adjacent chamfers is larger than the combined height of the carrier and the substrate.

9. The carrier FOUP of claim 7, wherein the first and second plurality of capture features are disposed in an alternating arrangement offset from a centerline of the door and are configured to secure the carrier when the door is closed.

10. The carrier FOUP of claim 7, wherein the plurality of alignment features each comprise a curved surface facing the door.

11. The carrier FOUP of claim 7, wherein each of the first and second plurality of chamfers comprises:
    a straight portion; and
    a sloped portion configured to push the straight portion of the carrier such that the carrier is placed level on the chamfer.

12. The carrier FOUP of claim 7, wherein each alignment feature of the plurality comprises a wedge insert, and the wedge insert is configured to align the carrier.

13. A method of storing a carrier, comprising:
    placing the carrier in a carrier front opening unified pod (FOUP) comprising:
       a body, comprising:
          a plurality of side walls, each side wall comprising a plurality of chamfers, defining a plurality of stacked carrier receiving slots, each slot configured to support a straight portion of the carrier; and
          a back wall, comprising a plurality of angular alignment features configured to align the carrier; and
          a door coupled to the body, the door comprising a first plurality of capture features horizontally offset from a second plurality of capture features, the first plurality of capture features aligned with every other carrier receiving slot, the second plurality of capture features aligned with every other carrier receiving slot, the first plurality of capture features align with different carrier receiving slots than the second plurality of capture features, the first and second plurality of capture features are configured to secure carriers within the carrier receiving slots when the door is closed, such that the carrier is disposed over a chamfer on either side of the carrier, and such that a straight portion of the carrier is supported by the chamfers; and
       closing the door.

14. The method of claim 13, wherein the door further comprises a capture apparatus comprising:
    a capture carrier base.

15. The method of claim 14, wherein the closing the door secures the carrier in one of the plurality of capture features.

16. The method of claim 13, wherein the closing the door aligns the substrate with one of the alignment features.

17. The method of claim 13, wherein the plurality of alignment features each comprise a wedge insert, and the closing the door aligns the carrier.

18. The method of claim 13, wherein the spacing between adjacent chamfers is larger than the combined height of the carrier and a substrate.

19. The method of claim 13, wherein each of the plurality of chamfers comprises a straight portion and a sloped portion; and
    placing the carrier comprises the sloped portion pushing the straight portion of the carrier such that the carrier is placed level on the chamfer.

20. The method of claim 13, further comprising placing another carrier in the carrier FOUP before the closing the door.

\* \* \* \* \*